(12) United States Patent
Roozeboom et al.

(10) Patent No.: US 8,085,524 B2
(45) Date of Patent: Dec. 27, 2011

(54) INTEGRATED CAPACITOR ARRANGEMENT FOR ULTRAHIGH CAPACITANCE VALUES

(75) Inventors: Freddy Roozeboom, Waalre (NL); Johan H. Klootwijk, Eindhoven (NL); Antonius L. A. M. Kemmeren, Breda (NL); Derk Reefman, Best (NL); Johannes F. C. M. Verhoeven, Geldrop (NL)

(73) Assignee: IPDIA, Caen (FR)

( * ) Notice: Subject to any disclaimer, the term of this patent is extended or adjusted under 35 U.S.C. 154(b) by 763 days.

(21) Appl. No.: 12/092,608

(22) PCT Filed: Nov. 2, 2006

(86) PCT No.: PCT/IB2006/054063
§ 371 (c)(1),
(2), (4) Date: May 19, 2008

(87) PCT Pub. No.: WO2007/054858
PCT Pub. Date: May 18, 2007

(65) Prior Publication Data
US 2008/0291601 A1    Nov. 27, 2008

(30) Foreign Application Priority Data
Nov. 8, 2005  (EP) .................................. 05110488

(51) Int. Cl.
*H01G 4/228* (2006.01)
(52) U.S. Cl. ............... 361/306.2; 361/301.2; 361/301.4; 361/306.1; 361/303; 361/305
(58) Field of Classification Search ............... 361/306.2, 361/306.1, 301.2, 301.4, 303–305; 438/253–254, 438/397; 257/395–396
See application file for complete search history.

(56) References Cited

U.S. PATENT DOCUMENTS

| | | | |
|---|---|---|---|
| 5,354,701 A | 10/1994 | Chao | |
| 6,261,895 B1 * | 7/2001 | Adkisson et al. | 438/240 |
| 6,897,508 B2 | 5/2005 | Sneh | |
| 6,989,560 B2 * | 1/2006 | Koike et al. | 257/296 |
| 6,992,368 B2 * | 1/2006 | Volant et al. | 257/532 |
| 7,312,131 B2 * | 12/2007 | Wu | 438/397 |
| 2003/0213989 A1 | 11/2003 | Delpech et al. | |
| 2004/0228067 A1 | 11/2004 | Gutsche et al. | |

* cited by examiner

FOREIGN PATENT DOCUMENTS

| | | |
|---|---|---|
| DE | 10358299 A1 | 7/2005 |
| EP | 1359607 A2 | 11/2003 |
| KR | 20050010214 A | 1/2005 |
| WO | 2004114397 A1 | 12/2004 |

OTHER PUBLICATIONS

Roozeboom, F; et al "High-Density, Low-Loss MOS Capacitors for Integrated RF Decoupling" Proceedings 2001. International Symposium on Microelectronics (SPIE vol. 4587) IMAPS—International Microelectronics and Packaging Society, 2001, pp. 477-483, Oct. 9, 2001.

*Primary Examiner* — Nguyen T Ha
(74) *Attorney, Agent, or Firm* — Hamre, Schumann, Mueller & Larson, P.C.

(57) ABSTRACT

An electronic device includes at least one trench capacitor that can also take the form of an inverse structure, a pillar capacitor. An alternating layer sequence of at least two dielectric layers and at least two electrically conductive layers is provided in the trench capacitor or on the pillar capacitor, such that the at least two electrically conductive layers are electrically isolated from each other and from the substrate by respective ones of the at least two dielectric layers. A set of internal contact pads is provided, and each internal contact pad is connected with a respective one of the electrically conductive layers or with the substrate. A range of switching opportunities is opened up that allows tuning the specific capacitance of the capacitor to a desired value.

17 Claims, 6 Drawing Sheets

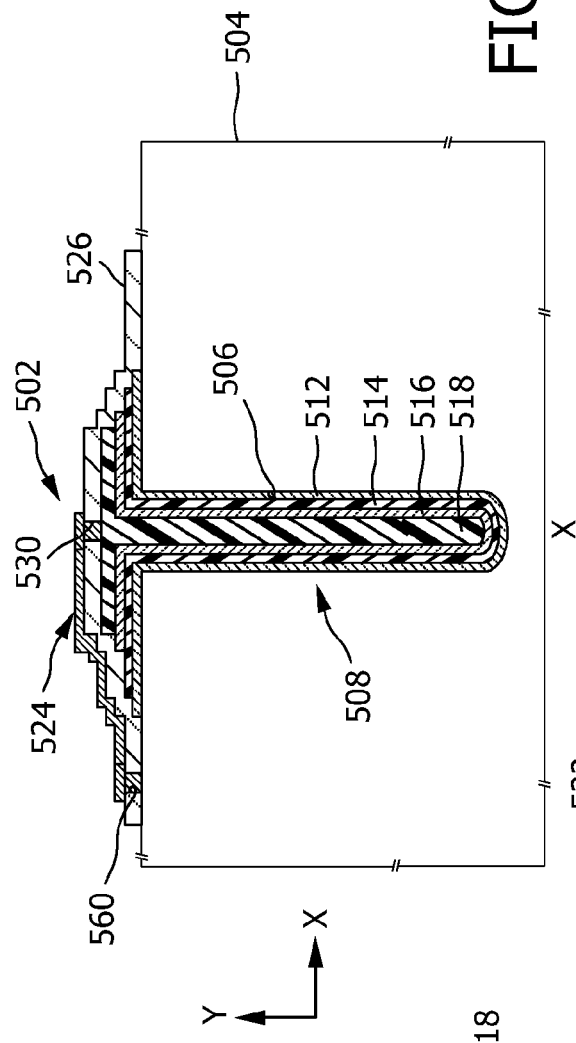
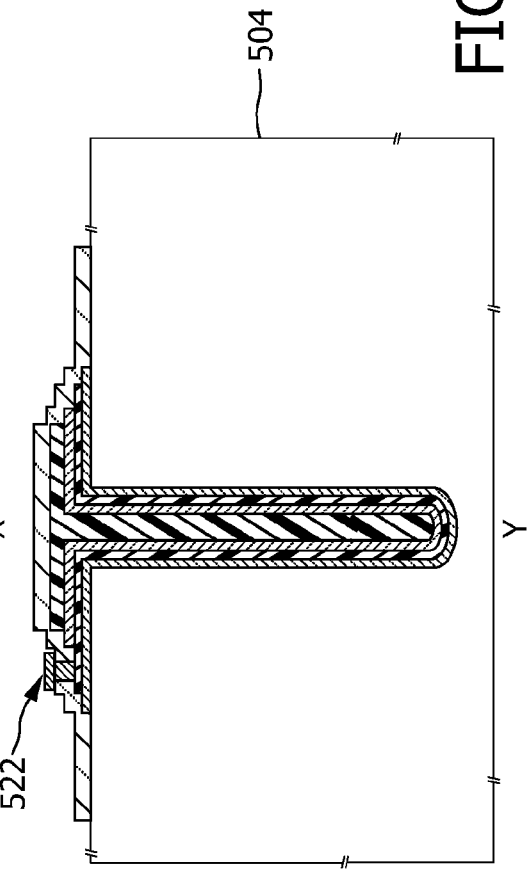
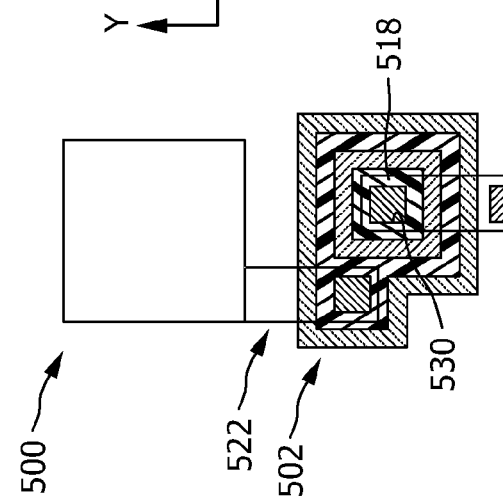
FIG. 5b
FIG. 5c
FIG. 5a

INTEGRATED CAPACITOR ARRANGEMENT FOR ULTRAHIGH CAPACITANCE VALUES

FIELD

The present invention relates to an electronic device that comprises, on a first side of a substrate, at least one trench capacitor that has a shape of a filled pore in the substrate.

BACKGROUND

It is well known that the capacitance of a capacitor device scales with the area of the capacitor electrodes, with the dielectric constant of the dielectric material between the capacitor electrodes, and with the inverse of the distance between the capacitor electrodes.

To increase the area of the capacitor electrodes comprised in electronic devices, which are formed by integrated circuits on a semiconductor chip, trench capacitors have widely been used. In a trench capacitor, the electrodes are formed by electrically conductive layers deposited in a recess or pore prepared in the substrate (wafer). A pore or trench can for instance be made by locally etching the substrate. The production of dense arrays of such features is well known. Electrode layers can be formed in the pores by known deposition techniques, such as low-pressure chemical vapor deposition (LPCVD) or atomic layer deposition (ALD). The electrically conductive layers are electrically isolated from each other and from the substrate by interposed dielectric layers.

A pore filled in this way to form a trench capacitor typically has a general shape resembling the letter "U" in a cross-sectional view. It is known to arrange a large number of pores in a substrate, in the form of a pore array, and to deposit step-conformal, that is, uniformly thick electrode layers in all pores in an attempt to achieve high capacitance values in electronic devices containing trench capacitors. A capacitance density, defined as a capacity value per unit area, is used to characterize such trench capacitor devices. Capacitance density values of about 30 $nF/mm^2$ with a breakdown voltage of 30 V can be achieved using MOS (Metal-Oxide-Semiconductor)/MIS (Metal-Insulator-Metal) capacitor layer stacks grown in pore arrays etched in a high-surface area silicon substrate, see WO2004/114397.

SUMMARY

Double and triple-layer-stack trench capacitors are known from DRAM (dynamic random access memory) applications, see US2004/0228067 and U.S. Pat. No. 6,897,508 B2, respectively. However, the trench capacitor structures described in these documents are designed for operation at low voltages, typically in the range of a few Volts. In addition, trench capacitors in DRAM applications require a refresh of the stored charge amount several times per second, which is not acceptable in applications involving higher voltages in the range of tens of Volt, or higher-frequency signals, like radio-frequency (RF) signals. DRAM memory devices further have trench capacitors that are optimized for a small, i.e., deep sub-micrometer pitch between adjacent pores in the substrate.

US 2003/0213989 A1 describes a trench capacitor device, which, in a cross-sectional view has two rectangular-shaped trench capacitors with a filling in the form of a metal-polysilicon-dielectric-polysilicon layer sequence. According to this document, high specific capacitance values between 30 and 100 $nF/mm^2$ can be achieved with this structure, when using dielectric layers made from a high-k dielectric material like $Ta_2O_5$. The electrodes of the trench capacitor of US 2003/0213989 are independent from the potential of the substrate. A disadvantage of this known capacitor is that its capacitance density is fixed by its structural design, that is, the selected dimensions and materials of the trench filling. Therefore, use of this type of capacitor for different application purposes having different capacitive requirements that may even vary in time during operation is not possible.

It is therefore an object of the present invention to provide an electronic device with a trench capacitor that is suitable for higher-voltage or higher-frequency applications and that allows a variation of the capacitance after the pore filling has been made.

According to a first aspect of the present invention, an electronic device is provided, comprising, on a first side of a substrate, a least one trench capacitor that has a shape of filled pore in a substrate. The trench capacitor includes a pore filling in the form of an alternating layer sequence of at least two dielectric layers and at least two electrically conductive layers, such that the at least two electrically conductive layers are electrically isolated from each other and from the substrate by respective ones of the at least two dielectric layers, and a set of internal contact pads on the first substrate side, wherein each internal contact pad is connected with a respective one of the electrically conductive layers or with the substrate.

In the electronic circuit device of the invention, the alternating layer sequence comprises at least two dielectric layers and at least two electrically conductive layers, such that the at least two electrically conductive layers are electrically isolated from each other and from the substrate by respective ones of the at least two dielectric layers.

Typically, the alternating layer sequence forms a pore filling that has a "U"-shape in upright or inverted form, depending on the processing. Instead of using a trench capacitor, which involves processing for forming and filling a hole in the form of a trench or a pore in the substrate, an inverted structure can be used as an alternative embodiment. This alternative inverted structure is known as a pillar capacitor. A pillar capacitor is formed by an etching process that forms vertical pillars in the substrate instead of vertical holes. A pillar capacitor structure provides more space between the etched structures, thus allowing the production of higher-capacitance devices. In addition the use of pillar capacitors allows reducing aspect-ratio-dependent etching effects during later processing, which are detrimental for the homogeneity of the deposited layer structure of the capacitor. It also allows an easier three-dimensional diffusion of gaseous reagents and reaction products, thus enabling higher reaction rates in the processes involved, e.g., dry-etching of the features and deposition of LPCVD or ALD-grown layers onto the features. However, both alternative types shall be summarized under the term trench capacitor for the purpose of the present application, as well as small shape variations, such as a rectangular shape of a pore or trench resembling the letter "U" in upright or inverted form in a cross-sectional view.

The term "metal layer", as used herein, is also to be understood in a broad sense. An alternating layer sequence of the capacitor device of the invention may for instance take the form metal-insulator-metal-insulator-metal (MIMIM), wherein any metal layer can be replaced by an appropriately doped semiconductor layer, such as doped polysilicon. Thus, the term "metal" in the layer sequence is to be understood to comprise electrically conductive layers in general, where the first metal "layer" may even just be the highly doped (low-resistivity) conductive substrate material itself.

The electronic circuit device of the invention has a set of internal contact pads on the first substrate side. Each internal contact pad is connected with a respective one of the electrically conductive layers or with the substrate. An internal contact pad on the first substrate side provides an internal electrical interface to a conductive layer of a trench capacitor, or to the substrate, or to a conductive layer and the substrate, or to a circuit element on the same substrate, for instance to a switching device. An internal contact pad thus serves for a formation of an interconnect to another conductive layer (or the substrate) of the same trench capacitor or to a conductive layer (or the substrate) of another trench capacitor. Of course, connection to more than one other conductive layer is possible as well. Capacitor electrodes can thus be designed according to application-specific needs by a suitable network of interconnects between internal contact pads. An internal contact pad in the electronic circuit device of the invention is not an interface to an external device, and should not be confused with a contact pad that provides such an interface to an external device.

By providing an individual internal contact pad for different electrically conductive layers, a range of switching opportunities is opened up that for instance allows tuning the specific capacitance of a capacitor to a desired value.

The electronic device of the invention thus provides a flexible fabrication platform for a multitude of electronic circuit devices that include an on-chip capacitor. A common processing sequence can be used for the formation of the trenches, the alternating layer sequence and the internal contact pads. Processing of different devices differs only in mask steps for the interconnects between the internal contact pads, which are typically formed in one or several metal layers above the substrate. Thus, accounting for electrical connections between electrically conductive layers of a trench capacitor, or, when multiple trenches are used, between electrically conductive layers of different trench capacitors is not necessary before the formation of the metal-layer architecture.

An application-specific electrical connection of the electrically conductive layers of the trench capacitor(s) can thus be made after the processing steps of the electronic device that involve the formation of the trench capacitor structure, by providing suitable interconnects, or even during operation of the electronic circuit comprising the trench capacitor, namely by switching. This will be further elucidated in the context of preferred embodiments of the electronic circuit of the invention, which will be described in the following.

In a preferred embodiment, an internal substrate contact pad is provided that is connected with the substrate, which has a low resistivity. In this embodiment, the set of internal contact pads therefore also includes the internal substrate contact pad. Due to the provision of another conductive "layer" in the form of the conductive substrate, the electronic device of this embodiment provides an even higher flexibility with respect to switching configurations. In an alternative embodiment, the substrate is connected with at least one other electrically conductive layer through a internal contact pad of that electrically conductive layer.

In a further preferred embodiment, internal contact pads are connected to electrically conductive layers of the trench capacitor and to the substrate in a one-to-one manner. This way, maximum flexibility is provided for interconnects between different conductive layers.

A preferred embodiment of the electronic device of the invention comprises a plurality of trench capacitors. For each trench capacitor, a respective set of internal contact pads is provided. This embodiment further enhances the flexibility of the electronic device of the invention. The provided multitude of trench capacitors forms a resource platform for a circuit design. A desired number of trench capacitors can be integrated into a circuit on the same chip by suitable interconnects with each other or with other circuit elements, according to the needs in a particular electronic circuit device.

This embodiment also allows forming a distributed capacitor structure, which provides a large flexibility in the tuning of the overall capacitance value of a distributed capacitor structure by accumulating the area of a plurality of conductive layers to form a capacitor electrode. Depending on the desired capacitance value, a corresponding number of trench capacitors can be connected by providing interconnects in one or several metal layers of an interconnect structure formed on top of the trench capacitor structure, between respective electrically conductive layers of different pore fillings that together form a common electrode.

In particular, a first capacitor electrode of the distributed capacitor structure is in a preferred embodiment formed by a first number of corresponding electrically conductive layers, at least one conductive layer from each trench capacitor of the distributed capacitor structure. These conductive layers are connected by interconnects between their respective internal contact pads.

Preferably, in this embodiment, a second capacitor electrode of the distributed capacitor structure is formed by a second number of corresponding electrically conductive layers, at least one conductive layer from each trench capacitor of the distributed trench capacitor structure. Here again, the conductive layers and the substrate regions are connected with each other by interconnects between respective internal contact pads to form the second capacitor electrode.

The second number of conductive layers may be selected so as to obtain a symmetric or deliberately asymmetric electrode configuration with the first capacitor electrode, i.e., first and second capacitor electrodes with an area that is approximately or exactly equal (symmetric case) or unequal (asymmetric case).

Another embodiment of a distributed capacitor structure comprises several capacitors with one common first electrode, which is formed by the first number of conductive layers, according to the previous embodiment. Two or more second electrodes are provided, each forming an asymmetric electrode configuration with the first electrode, each individual second electrode thus having, for instance, a smaller area than the first electrode. As will be elaborated in connection with another embodiment further below, the second electrodes may be switchably connected in parallel to allow an area accumulation, so as to provide a tuning possibility for the area of a second capacitor electrode during operation of the electronic device.

In a preferred configuration of an embodiment of the distributed capacitor structure with two capacitor electrodes, the second electrode is connected to ground and the first electrode is floating, that is, it is not electrically connected. In this embodiment, the floating first electrode can be formed by an electrically conductive layer of the alternating layer sequence that is closer to the substrate than the electrically conductive layer, which forms the second electrode and is connected to the substrate and to ground potential. A better reduction of a parasitic capacitance between the floating electrode and the substrate is achieved, however, if the floating electrode is more distant from the substrate. Of course, a floating electrode can also be realized with a single trench capacitor.

In another embodiment, the alternating layer sequence comprises two dielectric layers, two conductive layers and, in addition, either a third conductive layer or the substrate of the trench capacitor in a MIMIM configuration. A MIMIM configuration can be configured to contain two sub-capacitors. For instance, two out of the conductive layers are connected by interconnects between their internal contact pads to form a parallel connection of a first and a second sub-capacitor, the remaining conductive layer forming a capacitor electrode common to both sub-capacitors.

Preferably, the two dielectric layers of the two sub-capacitors differ in a ratio between the respective layer thickness and a respective dielectric constant that is specific for a given material of a respective dielectric layer. Since the capacitance of a capacitor generally scales with the inverse of this ratio, the two sub-capacitors will then have different capacitance values. This can be achieved by selecting different thickness values of the dielectric layers included in the alternating layer sequence or by setting different dielectric constants of the dielectric layers included in the alternating layer sequence by a proper material selection. Of course, both measures can also be combined.

Assuming, as an illustrative example of this embodiment, a MIMIM configuration with two sub-capacitors of different capacitance values, by connecting different internal contact pads of the two electrically conductive layers and the substrate one can select either a first capacitance, a second capacitance or, in a parallel configuration of first and second capacitances, the sum of the first and second capacitances. The desired capacitance value can be set during the manufacturing process, or even during operation, as will be clear from an embodiment described further below that includes a switching element.

In a further preferred embodiment the alternating layer sequence comprises at least three dielectric layers and at least three electrically conductive layers, such that the at least three electrically conductive layers are electrically isolated from each other and from the substrate by respective ones of the at least three dielectric layers. The present embodiment is for instance implemented by a layer sequence of the type MIMIMIM (or MIMIMIS). With capacitors of this type, one can greatly enhance the capacitance density and realize a capacitor device with an ultra-high capacitance in silicon. Capacitance values that can be reached with the present embodiment are in the range of 100 to 300 $nF/mm^2$, with a breakdown voltage between 10 and 70 V. New applications can thus be envisaged, for which particularly high capacitance density requirements have been formulated. Examples of such applications are power management units, charge pump applications, and off-digital chip decoupling for television devices.

With regard to their morphology and texture, the dielectric layers of the alternating layer sequence are amorphous in one embodiment.

In a further embodiment, a switching element is interconnected between two internal contact pads of one set of internal contact pads associated with one trench capacitor, the switching element being configured, in a first switching state, to electrically connect the two internal contact pads with each other and, in a second switching state, to electrically disconnect the two internal contact pads from each other, the switching element having a control input port and being further configured to be in either the first or the second switching state, depending on which of two predefined control signals is applied to the control input port. The electronic circuit of this device allows to change the interconnect configuration during operation. The switching element is preferably a transistor, such as a MOSFET, or a micro-electro-mechanical systems (MEMS) switch, or a PIN-diode. A MOSFET can be formed in the substrate. Alternatively, a thin-film transistor (TFT) can be formed on the substrate. Referring again to the previous embodiment, the switching elements can be used to set a desired capacitance value of the trench capacitor by a suitable selection or combination of the sub-capacitors during operation. A control unit must be provided that is connected with each of the switching elements to control their respective switching states.

With the present embodiment of the invention, it is thus not only possible to connect or disconnect a trench capacitor during operation, but also tune the capacitance density to different values in order to obtain desired effects. For instance, a higher breakdown voltage can be achieved if the intermediate electrode is not used. As another example, substrate effects can be reduced when the bottom electrode is not used.

In another embodiment, switching elements are used to connect or disconnect different trench capacitors comprised by the electronic device, and not individual layers of one and the same trench capacitor. At least one interconnect between two internal contact pads of different sets of internal contact pads therefore includes a switching element. The switching element is configured, in a manner that is similar to the previous embodiment, to electrically connect the two internal contact pads with each other in a first switching state, and, in a second switching state, to electrically disconnect the two internal contact pads from each other, the switching element having a control input port and being further configured to be in either the first or the second switching state, depending on which of two predefined control signals is applied to the control input port.

A filled pore, in a direction parallel to the first substrate side, preferably has a diameter between 1 and 3 micrometer, and an aspect ratio, defined as the ratio of trench depth over trench diameter, of between 10 and 30. Using such large lateral extensions, especially high capacitance densities can be obtained by multiple-stack layer structures, such as MIMIM, MIMIMIM, etc. Such devices are suitable for applications in circuits that require both, a high capacitance, and an operation in a differential mode. Examples of such circuits are differential phase-locked loops (PLLs) in RF applications, and differential filters, as applied in television and video devices. A PLL needs a narrow-band filter, for which reason large capacitances are necessary. An important advantage of differential circuits is their insensitivity to noise.

According to a second aspect of the invention, an electronic circuit is provided that comprises the electronic device of the first aspect of the invention or one of its embodiments, as described herein above.

The use of the electronic device according to the first aspect of the invention enables very cost-effective electronic circuits due to the high capacitance density and their ability to be configured by interconnects or switching elements between the internal contact pads of the trench-capacitor electrodes. The electronic circuit of the second aspect of the invention provides a breakthrough in cost-effective off-chip decoupling for digital television, highly integrated DC-DC conversion in power management units, and in other applications.

Preferred embodiments of the electronic circuit of the second aspect of the invention comprise a charge-pump circuit that includes an electronic device according to the first aspect of the invention or one of its embodiments. Charge-pump circuits can be used in many applications, such as PLL circuits or DC-DC conversion circuits. A DC-DC voltage converter using an electronic device according to the first aspect of the invention or one of its embodiments can either be configured to have a high efficiency of, e.g. more than 80%, or can be configured to operate with very high power densities, which so far is impossible with existing integrated solutions. The option of having floating capacitor electrodes enables different DC-DC up-conversion and-down conversion schemes, such as (input:output) 1:2, 2:1, 1:3, etc. with low equivalent series resistance (ESR) and almost ideal low-loss parasitic capacitance to the substrate. This will be elucidated further with reference to the figures below. As is well known, both the ESR and its stray capacitance to ground determine the capacitor's losses, which in turn impact the efficiency and reliability of the electronic circuit.

Other applications of charge pumps are related to supplying a voltage to an electronic circuit in a configuration, where no other high-enough voltage is available, e.g. in LCD (liquid crystal device) backlights, CCDs (charge-coupled devices), flash lamps, etc. As stated before, the electronic device suitably comprises other elements in addition to trench capacitors, such as planer capacitors, inductors, resistors and diodes. Most suitably, the device is used as a carrier for a further device, such as an integrated circuit. The devices may be mutually coupled with conventional connectors, such as wirebonding and solder balls. Trenches may be present in the device so as to contact the opposite side, such as known per se from WO-A 2004/114397, allowing the use of said opposite sides for thermal dissipation or for the definition of the contact structures.

Preferred embodiments of the electronic device of the invention and of electronic circuits will next be described with reference to the Figures.

BRIEF DESCRIPTION OF DRAWINGS

FIG. 5a to FIG. 5c show different views of a third embodiment of the invention.

DETAILED DESCRIPTION

Figure 1:
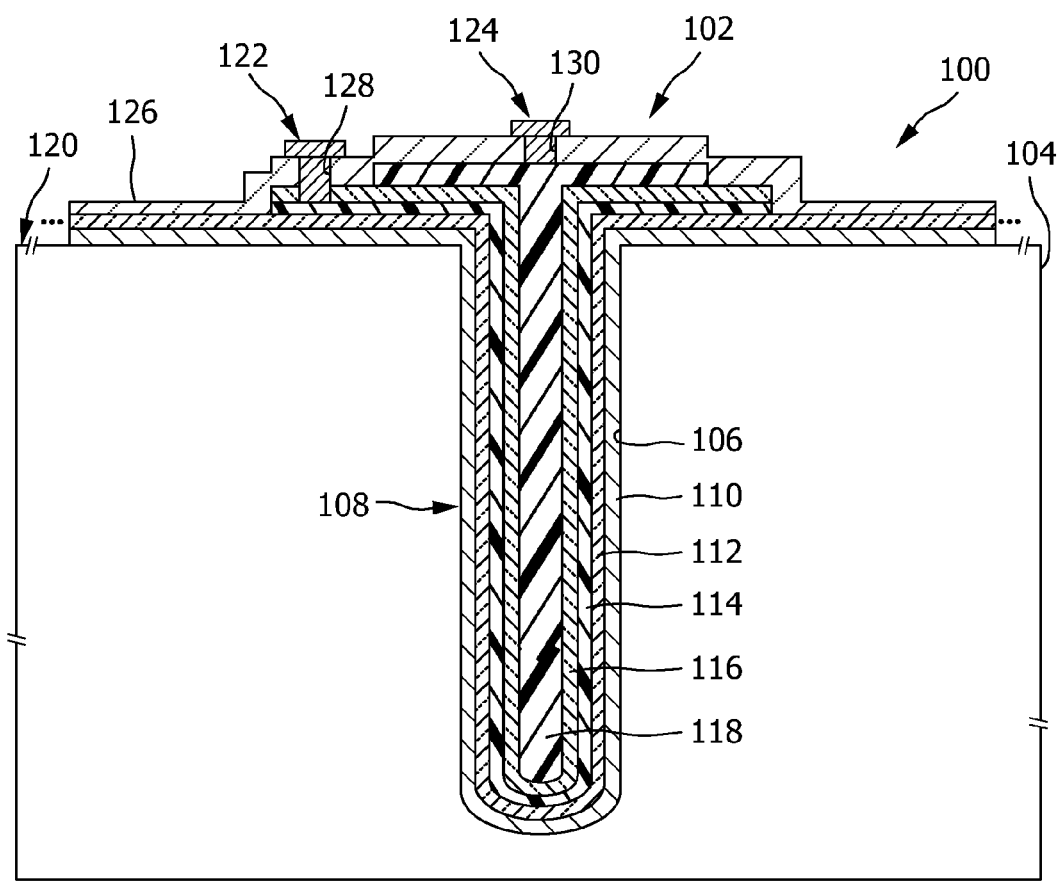
FIG. 1 shows a schematic cross-sectional view of a trench capacitor for use in an electronic device according to a first embodiment of the invention, wherein the trench capacitor has a floating substrate electrode.

FIG. 1 shows a schematic cross-sectional view of a trench capacitor forming an electronic device 100, according to a first embodiment of the invention. The electronic device 100 comprises a MIMIM capacitor 102 in a high-resistivity silicon substrate 104. This figure is simplified in that only structural elements are shown, which are essential to explain the gist of the invention. In particular, further details of metal layers for wiring are omitted. The shown device structure can thus also be considered as a platform for a variety of different application devices.

In the following paragraphs the structure of trench capacitor 102 will be described in more detail.

Trench capacitor 102 is formed in a pore 106 in substrate 104. The pore typically has a diameter of about 1.5 μm and a depth of between 10 and 30 μm. The depth of 30 μm is reached when using a dry-etching technique for producing the pore before depositing a pore filling. When using a wet-etching technique, depths of at least 200 μm can be obtained.

A pore filling of pore 106 is formed by an alternating layer sequence 108 comprising a highly n-doped ($n^{++}$) layer 110, a first dielectric layer 112, a conductive poly-silicon layer 114, a second dielectric layer 116, and a second conductive poly-silicon layer 118, the latter filling the center of the pore. The first dielectric layer 112 is a nominally 30 nm thick dielectric layer stack consisting of a thermal oxide, a silicon nitride layer grown by low pressure chemical vapor deposition (LPCVD), and a second oxide layer of 5 nm thickness deposited by LPCVD using tetraethylorthosilicate (TEOS). Poly-silicon layer 114 preferably is an n-type in-situ doped poly-silicon layer deposited by LPCVD from $SiH_4$ and diluted $PH_3$.

This sequence of an ONO layer stack and a poly-Si is repeated by layers 116 and 118 with the exception, that both oxide cladding layers in the second dielectric layer 116 are TEOS layers deposited by LPCVD.

The overall shape of the original pore 106 and the individual layers of the alternating layer sequence 108 resemble an upright "U". The U-shape is preferred because of the breakdown voltage that can be achieved by avoiding sharp edges in the electrodes. It is therefore preferred to have very smooth surfaces of the electrodes 110, 114, and 118. With the chosen design of the layer structure 108 it is possible to achieve high breakdown voltages. Electronic device 100 is therefore configured to handle voltages in the range of tens of volts.

As is obvious from the described layer structure, the dielectric layers 112 and 116 provide an electrical isolation between the conductive layers 110, 114, and 118, which are also refer to as electrode layers herein.

Substrate 104 typically contains an array of filled pores, which resemble pore 106 and the pore filling 108 provided by the layer sequence of layers 110 through 118. The pitch between adjacent pores preferably is in the range of 1.5-3 μm.

On the top side 120 of substrate 104, the layer sequence is continued as a horizontal layer stack parallel to the surface of top side 120 to provide a contact structure for the electrodes. In the present example, only the poly-silicon layers 114 and 118 are provided with contacts 122 and 124, respectively. An interlevel dielectric layer 126 provides electric insulation. Contacts 122 and 124 are made by, e.g., electrode-gun evaporative deposition of an aluminum layer of 1 μm thickness, and wet-etching after photolithographic steps.

After a furnace annealing step of 30 minutes at 1000° C., the conductivity of poly-silicon layers 114 and 118 is 1 mΩ*cm. Of course, this annealing step must be performed subsequently after the poly-Si deposition, at least before metal deposition.

Trench capacitor 102 of FIG. 1 therefore forms a MIMIM capacitor structure with a floating substrate electrode that is formed by $n^{++}$-electrode layer 110.

Figure 2:
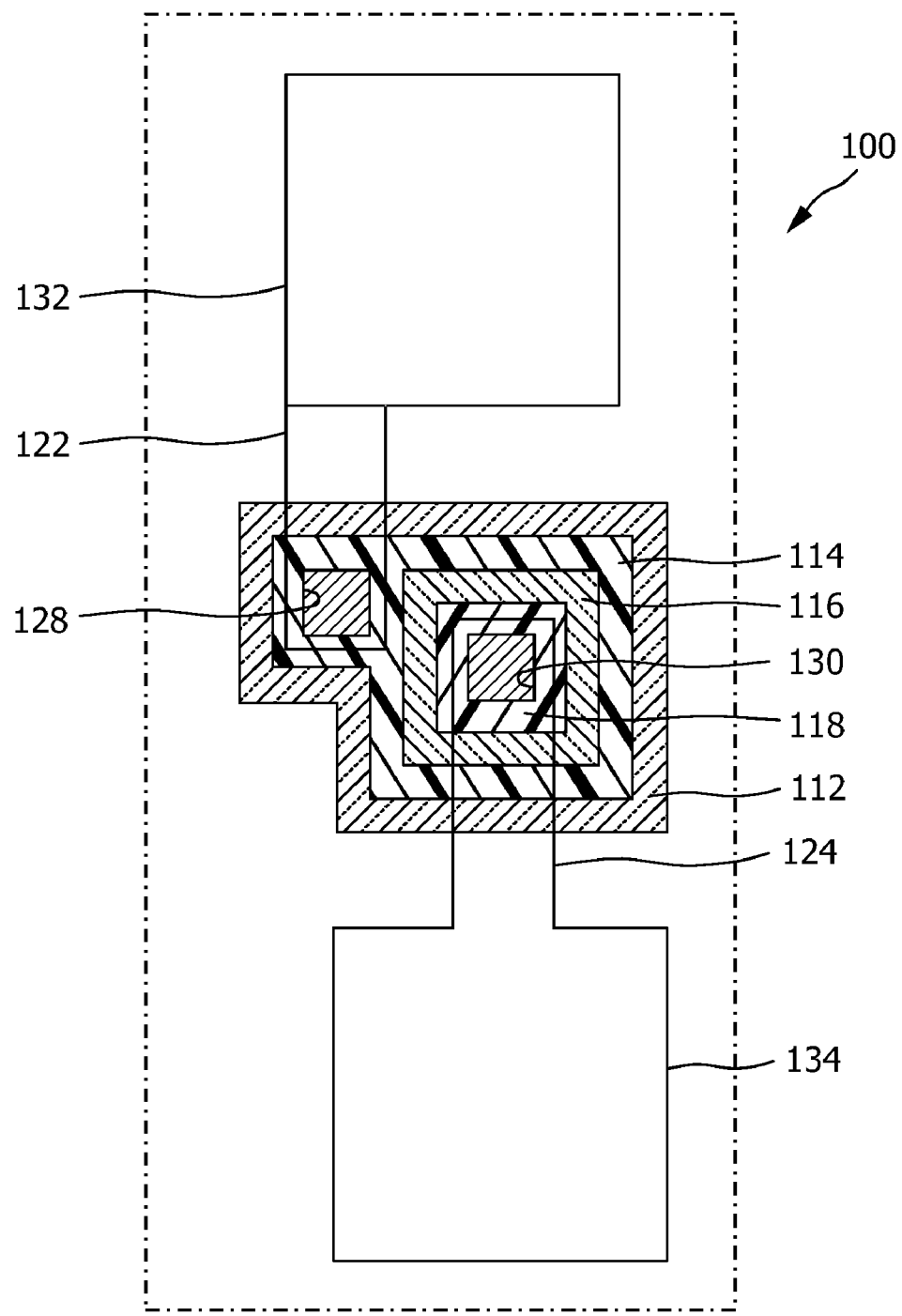
FIG. 2 shows a schematic top view of a processing stage of the electronic device of FIG. 1.

FIG. 2 shows a top view of electronic device 100. Note that n++-electrode layer 110 is not visible in this view because, when used in a capacitor-only process, the implantation is performed blanket, without the use of a mask. However it is clear that $n^{++}$-layer 110 surrounds dielectric layer 112.

Contacts 122 and 124 are connected with internal contact pads 132 and 134, respectively. Internal contact pads 132 and 134 provide a means for connecting the respective electrode layers 114 and 118 to electrode layers of other trench capacitors, or to circuit elements of electronic device 100. Internal contact pads 132 and 134 can be provided on any metal level above the trench capacitor structure 102 of FIG. 1. Contact openings 128 and 130 through the respective interlevel dielectric layers have to be formed accordingly.

As mentioned before, the n++ poly-silicon layer 110, which can also be considered as a bottom electrode of trench capacitor 102, is not used. That means, there is no contact provided to this layer. Leaving the bottom electrode unused reduces substrate effects. Of course, a internal contact pad could be provided also for bottom electrode 110, without, however, forming a connection to other electrodes or other circuit elements, thereby obtaining the same effect. However, in the present case, chip area can be saved by omitting a internal contact pad for bottom electrode 110. Based on a typical capacitance density of 100 to 300 nF/mm$^2$ one can design the typical area needed for a 10 nF trench capacitor to be of the order of 200 to 300 μm$^2$.

Figure 3:
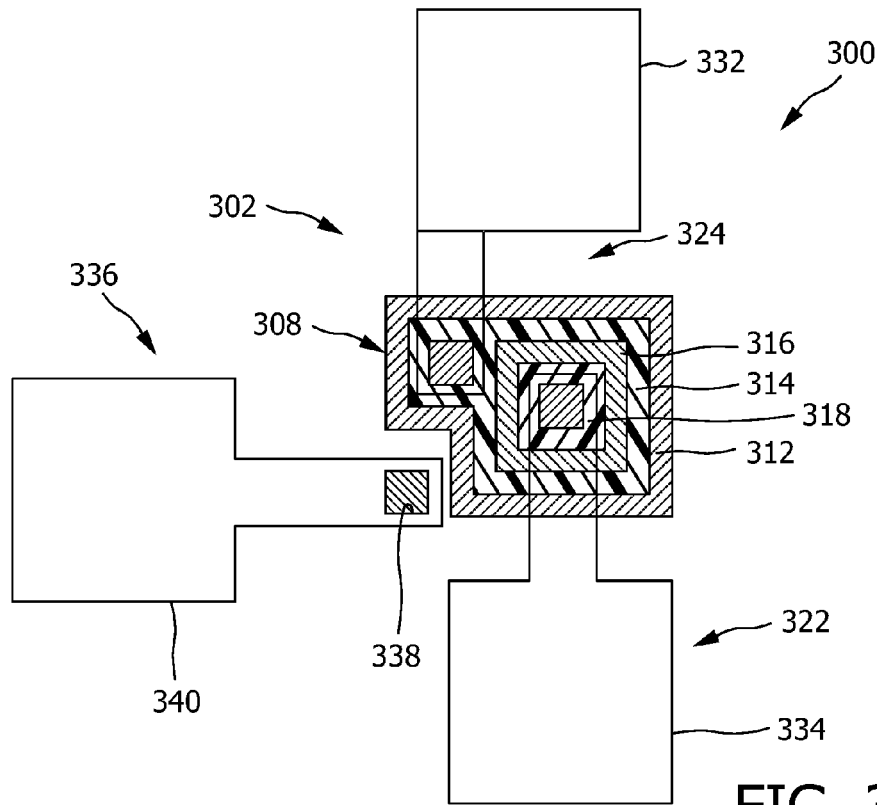
FIG. 3 shows a top view of a second embodiment of an electronic device of the invention in a processing stage.

FIG. 3 shows a top view of a second embodiment of an electronic device 300 of the invention in a processing stage. The overall structure of electronic device 300 resembles that of the previous embodiment, as explained with reference to FIGS. 1 and 2. Therefore, the following description will concentrate on differences and possible additional structural features of electronic device 300.

Electronic device 300 differs from electronic device 100 in that a separate substrate contact 336 is provided in addition to contact elements 322 and 324. A contact opening 338 filled with aluminum establishes an electrical contact between the substrate and internal contact pad 340. The electronic device offers the opportunity to not only connect electrode layers 314 and 318 with each other or other electrode layers of trench capacitors comprised by electronic device 300, but also to provide respective interconnections for the substrate. Due to the provision of the contacts, in the MIMIM structure of electronic device 300 one can chose between different capacity densities by connecting bond pads 332 and 340, 332 and 334, or 334 and 340, to obtain capacitance values according to C1+C2, or C1, or C2. To obtain a range of possible capacitance values, the capacitances C1 and C2 must be different. This can be achieved by an asymmetric structure of layer stack 308 of electronic device 300. For instance, the first dielectric layer 312 can be made larger or smaller than the second dielectric layer 316. This way, to give an illustrative example, capacitance densities of 30, 40 and 70 nF/mm$^2$ can be selected, depending on the interconnects between internal contact pads 332, 334, and 340.

Figure 4:
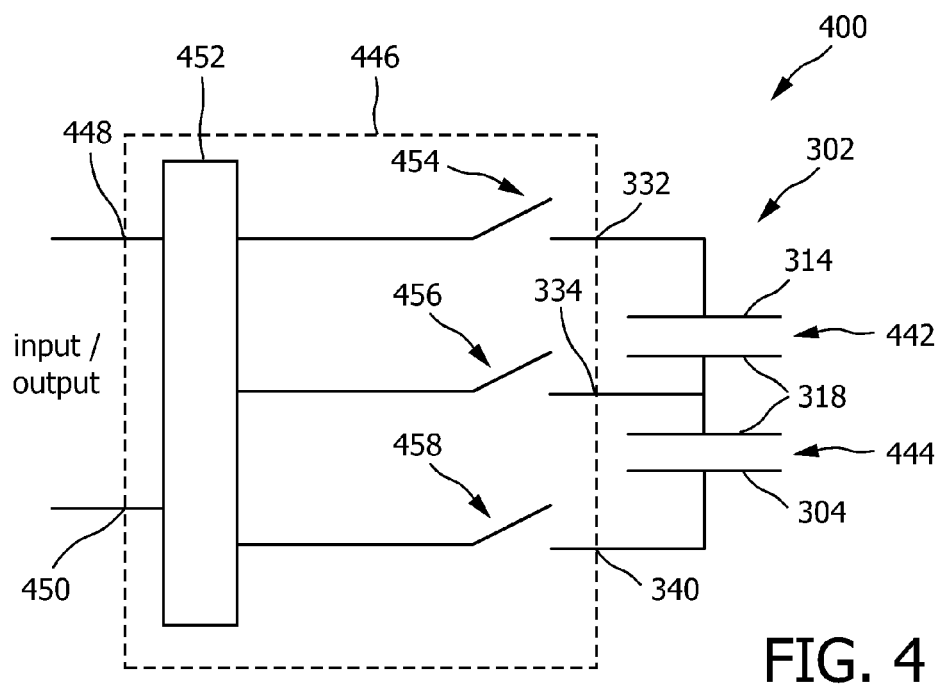
FIG. 4 shows an embodiment of an electronic circuit containing the electronic device of FIG. 3.

In combination with a switch, it is possible to realize a stepwise tunable capacitor. FIG. 4 shows an embodiment of an electronic circuit 400. For the purpose of the following description it will be assumed at electronic device 300 of FIG. 3 is used in electronic circuit 400. Capacitors 442 and 444 are thus provided with reference numerals that refer the functional symbols of the circuit diagram given in FIG. 4 back to structural elements of the trench capacitor 302 of FIG. 3.

More specifically, capacitor 442 comprises two electrodes formed by layers 314 and 318 of trench capacitor 302. Capacitor 444 comprises two electrodes formed by layer 318 and substrate 304. Interfaces between capacitor device 302 and connected input-output circuitry 446 are formed by internal contact pads 332, 334, and 340, respectively. Input-output circuitry 446 comprises an input interface 448, an output 450, a control circuit 452 and switching elements 454, 456, and 458, which are on one side connected with control circuit 452 and on the other side connected with trench capacitor 302 through internal contact pads 332, 334, and 340, respectively.

Switches 454 through 458 are preferably formed by transistors such as a MOSFET in the substrate or by a TFT thereon, but could also be MEMS switches or PIN-diodes. It is noted that if one uses atomic layer deposition techniques, switches 454 through 458 can be made in the same process. This will typically result in a lower number of required interconnects between trench capacitor 302 and control circuit 452.

During operation, control circuit 452 sets the switching state of switches 454 through 458 according to the desired total capacitance of trench capacitor 302. This way, the capacitance can be tuned in reaction to given circumstances, such as a change of frequency in an input signal, or a change of temperature or supply voltage that may occur during operation and change the response of electronic circuit 400 to a given input signal. By tuning the capacitance, the response can be adapted to desired characteristics. Electronic device 400 thus forms an adaptive capacitor.

FIG. 5a to FIG. 5c show different views of a third embodiment of an electronic device 500 of the invention.

FIG. 5a shows a top view corresponding to that of FIGS. 2 and 3. However, in the present case, a common internal contact pad is provided for inner electrode layer 518 and substrate 504. For this purpose, a contact element 522 connects inner electrode layer 518 as well as substrate 504 to a common bond pad 534. Respective contact openings 530 and 560 in interlevel dielectric layer 526 are filled with aluminum to establish an electrical contact. Other than that, the structure of trench capacitor 502 differs from that shown for trench capacitor 102 of FIG. 1 in that substrate 504 is a low-resistivity porous silicon-substrate, allowing the omission of an outer electrode layer like n++ poly-silicon layer 110 of FIG. 1. Instead, the layer structure uses an ONO dielectric layer stack 512 for deposition on the inner faces of pore 506. ONO layer forms a first dielectric layer, which is followed by a first poly-silicon layer 514 of 0.3 to 0.7 μm thickness. This is followed by second dielectric layer 516, which resembles second dielectric layer 116. An inner electrode layer 518 resembles in an electrode layer 118 of trench capacitor 102. While FIG. 5b shows a cross-sectional view in a plane perpendicular to a lateral X-direction, as indicated by corresponding arrows, FIG. 5c shows a cross-sectional view along a Y-direction. While the layer structure obviously does not differ, the chosen cross section reveals contact element 522.

For processing of the embodiment shown in FIGS. 5a through c, reference is made to the processing description given in the context of FIG. 1 and FIG. 2.

Figure 6:
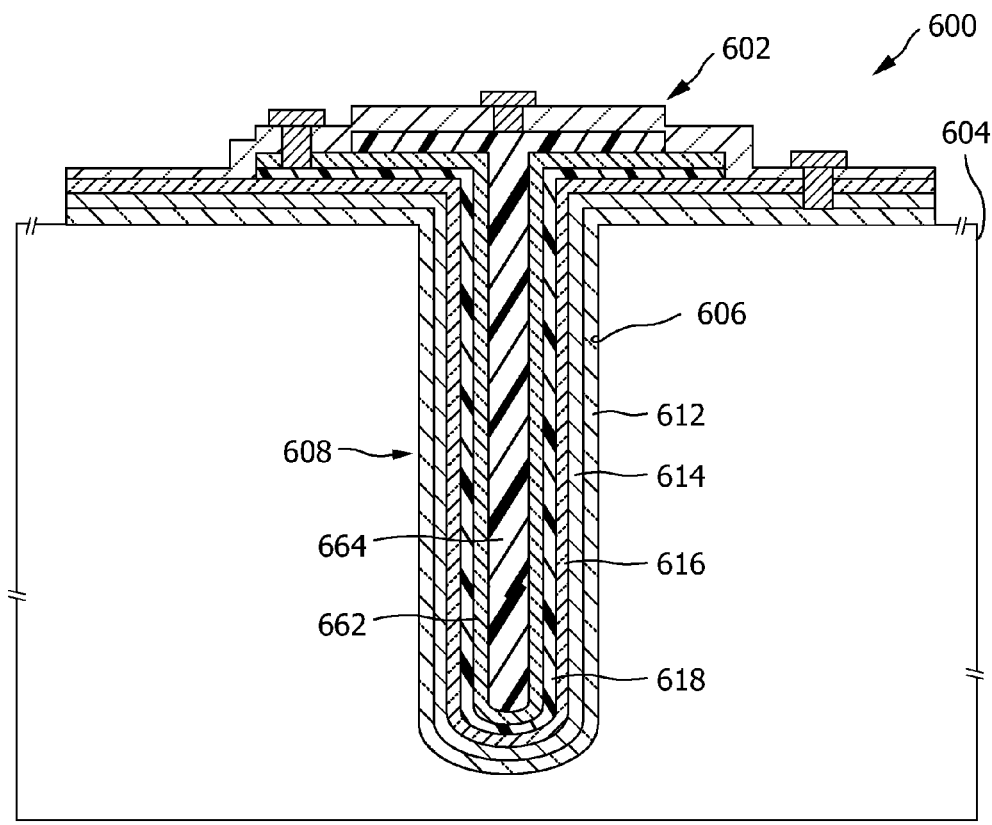
FIG. 6 shows a cross-sectional view of a fourth embodiment of the invention.

FIG. 6 shows a cross-sectional view of a fourth embodiment on an electronic device 600 of the invention.

Electronic device 600 comprises a trench capacitor 602 in a highly doped silicon substrate 604. Trench capacitor 602 is formed in a pore 606, which is formed by a layer stack consisting of a first dielectric layer 612. A first conductive (electrode) layer 614, a second dielectric layer 616, a second conductive (electrode) layer 618, a third dielectric layer 662, and a third conductive (electrode) layer 664. The resulting structure forms a MIMIMIM capacitor. Only the inner two electrode layers 618 and 664 are provided with contact elements in the present example.

The multilayer structure shown in FIG. 6 is manufactured by repeated ALD or another low-pressure and low-temperature CVD technique using high-k oxides (e.g., HfO$_2$, Ta$_2$O$_5$, etc.) and metallic layers, such as TiN, TaN, Ru, W or Cu. The thickness of the dielectric layers is in the range between 10 and 30 nm. The thickness of the metallic layers is in the range between 50 and 100 nm. The layers are patterned by lithographic techniques at the substrate surface in such a way that they compose an interdigitated capacitor structure with distinct multiple electrode internal contact pads. After ALD, the conductivity of the metallization is 100-200 μΩ*cm. The capacitor is finished with a scratch protection.

Figure 7:
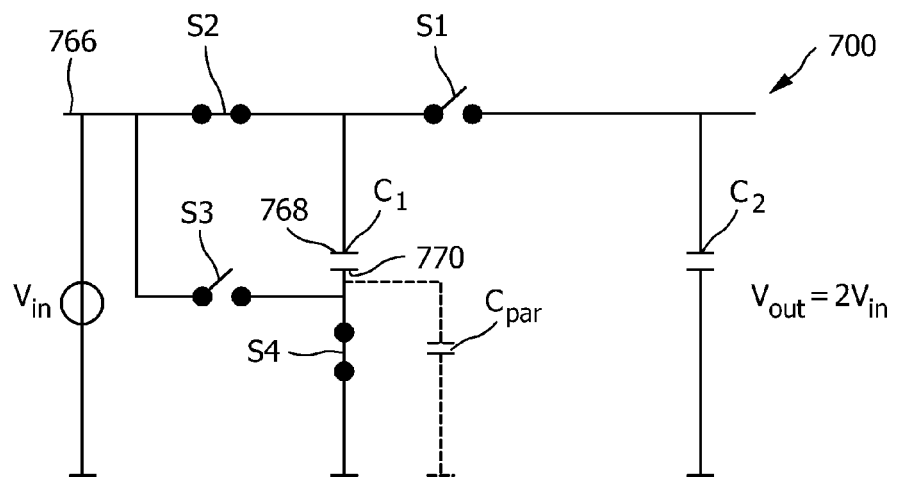
FIG. 7 shows, as another example of an electronic circuit comprising an electronic device of the invention, a schematic circuit diagram of a charge-pump converter.

FIG. 7 shows, as another example of an electronic circuit comprising an electronic device 700 of the invention, a schematic circuit diagram of a charge-pump converter. The boost charge-pump converter of FIG. 7 is configured to convert an input voltage $V_{in}$, provided on the left-hand side of the circuit diagram, into an output voltage $V_{out}=2V_n$, which can be measured parallel to a capacitor C2 on the right hand side of the circuit diagram of FIG. 7. A capacitor C1 is provided in parallel with capacitor C2, through a switch S1. A second switch S2 is provided between the signal input 766 of charge-pump converter 700 and a first electrode 768 of capacitor C1. A third switch S3 is provided in parallel to second switch S2 and connected between signal input 766 and a second electrode 770 of capacitor C1. The second electrode 770 is connected to reference potential via a fourth switch S4. For a general understanding of the application principle of the invention, it is instructive to realize that a single MIMIMIM trench capacitor can be used in the circuit of FIG. 7 to implement capacitors C1 and C2. In a real implementation, however, capacitors C1 and C2 will form parallel sub-capacitors of a device structure that contains a plurality of trench capacitors with suitably interconnected conductive layers. Each conductive layer of each trench capacitor is associated with one respective electrode of capacitor C1 or C2, respectively. As mentioned, the use of a MIMIMIM trench capacitor structure is possible. It is, however, also possible, to realize the circuit by using a plurality of MIMIM trench capacitors, wherein a first group of MIMIM trench capacitors forms capacitor C1, and a second group of trench capacitors forms capacitor C2.

In operation of boost charge-pump converter 700, through a controlled change of the switching states of switches S1 through S4 a doubling of the input voltage can be obtained. This operation is known per se and shall not be described in further detail. However, the use of a capacitor device C1 according to one of the previous embodiments is new in this application circuit. In this capacitor, electrode 768 is a floating electrode. By use of the capacitor structure, the parasitic capacitance $C_{PAR}$ of the capacitor device is minimized, as it is switched between zero volts and $V_{in}$. The capacitor device of the invention fulfills exactly these requirements. The parasitic capacitance can be reduced to very low values, hence substantially reducing the losses during operation of the charge pump. The ratio can be set to a different value if the two capacitors C1 and C2 have different values. For instance, if C2=2C1, an input-output ratio of 1:3 is obtained. The capacitances can be varied by providing different dielectric layer thicknesses for the two dielectric layers, different materials, or simply by interconnecting a smaller number of conductive layers from different trench capacitors, thus reducing the electrode area of a sub-capacitor. By interchanging input and output ports, the ratio is inverted. Note that the capacitance ratio between C1 and C2 and thus the input-output ratio of the charge-pump converter 700 is in one embodiment controllable during operation, for instance by connecting or disconnecting a number of conductive layers related to capacitor C2, thus respectively increasing or reducing the capacitance of this capacitor.

Figure 8:
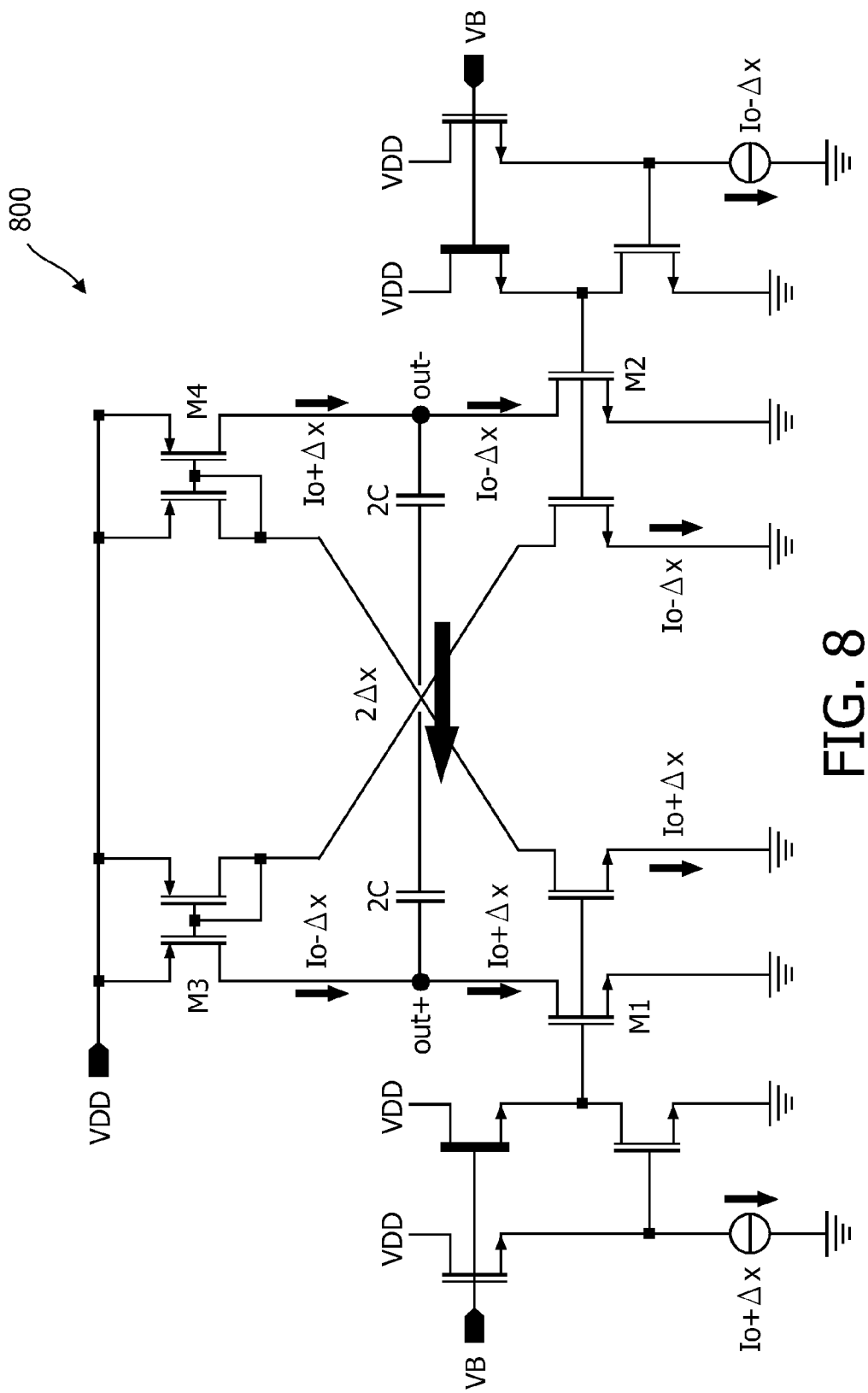
FIG. 8 shows, as a third example of an electronic circuit employing the electronic device of the invention, an output circuit of a phase-locked-loop circuit.

FIG. 8 shows, as a third example of an electronic circuit employing the electronic device of the invention, an output circuit 800 of a phase-locked-loop circuit. The circuit diagram of FIG. 8 is known per se. It forms a prominent application for the electronic device of the present invention in RF applications. Such circuits require both large capacitance values and an operation in a differential mode. Examples of such circuits are differential PLLs and differential filters as applied in television and video applications. In the circuit diagram 800, two capacitors labeled with 2C are floating. The use of floating capacitors, which are integrated into the substrate, is new in this type of circuit. The floating capacitors in the PLL output circuit of FIG. 8 enable a differential mode with high common mode rejection because of the extremely small parasitic capacitors to ground. The common center node of the capacitors is floating, and thus can vary in voltage with respect to ground. Due to the operation in a differential mode, the circuit filters out all common voltage variations, which would normally affect all nodes of the circuit. The capacitance of the two capacitors 2C must be large, in the order of tens of nF, in order to achieve a narrow bandwidth.

Floating capacitors could similarly be used in other filters like input filters for video receivers. The input filters serve to transmit only the desired frequency range and filter out all side bands. Also in these devices, a differential mode allows to filter out all variations generated by external influences.

The invention claimed is:

1. An electronic device comprising, on a first side of a substrate, at least one trench capacitor in the substrate, the trench capacitor including:
    an alternating layer sequence including at least two dielectric layers and at least two electrically conductive layers, such that the at least two electrically conductive layers are electrically isolated from each other and from the substrate by respective ones of the at least two dielectric layers, and
    a set of internal contact pads on the first substrate side, wherein each internal contact pad is connected with a respective one of the electrically conductive layers or with the substrate.

2. The electronic device of claim 1, comprising a plurality of trench capacitors, wherein a respective set of internal contact pads is provided with each trench capacitor of the plurality of trench capacitors.

3. The electronic device of claim 2, wherein the plurality of capacitors constitute a distributed capacitor structure that has a first capacitor electrode, which is formed by a first number of corresponding electrically conductive layers, at least one conductive layer from each trench capacitor of the distributed capacitor structure, the conductive layers being connected by interconnects between their respective internal contact pads.

4. The electronic device of claim 3, wherein the distributed capacitor structure has at least one second capacitor electrode, which is formed by a second number of corresponding electrically conductive layers, at least one conductive layer from each trench capacitor of the distributed capacitor structure, the second number of conductive layers being connected by interconnects between their respective internal contact pads.

5. The electronic device of claim 4, wherein at least one first conductive layer forms a first capacitor electrode and at least one second conductive layer forms a second capacitor electrode, wherein the first capacitor electrode is connected with an internal substrate contact pad, and wherein the second capacitor electrode is floating.

6. The electronic device of claim 2, which is configured to have a capacitance density of at least 100 $nF/mm^2$ and a breakdown voltage of typically between 10 and 70 V.

7. The electronic device of claim 3, wherein a switching element is interconnected between two internal contact pads of different sets of internal contact pads associated with different trench capacitors, the switching element being configured, in a first switching state, to electrically connect the two internal contact pads with each other and, in a second switching state, to electrically disconnect two the internal contact pads from each other, the switching element having a control input port and being further configured to be in either the first or the second switching state, depending on which of two predefined control signals is applied to the control input port.

8. The electronic device of claim 1, wherein the alternating layer sequence comprises two dielectric layers, two conductive layers and, in addition, either a third conductive layer or the substrate of the trench capacitor in a MIMIM configuration.

9. The electronic device of claim 1, wherein the at least two dielectric layers differ in a ratio between the respective layer thickness and a respective dielectric constant that is specific for a given material of a respective dielectric layer.

10. The electronic device of claim 9, wherein thickness values of the dielectric layers included in the alternating layer sequence are different from each other.

11. The electronic device of claim 9, wherein dielectric constants of the dielectric layers included in the alternating layer sequence are different from each other.

12. The electronic device of claim 1, wherein the alternating layer sequence comprises at least three dielectric layers and at least three electrically conductive layers, such that the at least three electrically conductive layers are electrically isolated from each other and from the substrate by respective ones of the at least three dielectric layers.

13. The electronic device of claim 1, wherein a switching element is interconnected between two internal contact pads of one set of internal contact pads associated with one trench capacitor, the switching element being configured, in a first switching state, to electrically connect the two internal contact pads with each other and, in a second switching state, to electrically disconnect the two internal contact pads from each other, the switching element having a control input port and being further configured to be in either the first or the second switching state, depending on which of two predefined control signals is applied to the control input port.

14. The electronic device of claim 1, wherein the filled pores have a diameter between 1 and 3 micrometer, and an aspect ratio, defined as the ratio of trench depth over trench diameter, of between 10 and 30.

15. An electronic circuit comprising an electronic device of claim 1.

16. The electronic circuit of claim 15, comprising a charge-pump circuit that includes an electronic device.

17. The electronic circuit of claim 15, which is configured as a DC-to-DC voltage converter.

* * * * *